(12) United States Patent
Lu et al.

(10) Patent No.: US 10,763,140 B2
(45) Date of Patent: Sep. 1, 2020

(54) SEMICONDUCTOR PROCESSING STATION

(71) Applicant: Taiwan Semiconductor Manufacturing Co., Ltd., Hsinchu (TW)

(72) Inventors: Chia-Wei Lu, Hsinchu (TW); Hon-Lin Huang, Hsinchu (TW); Hung-Chih Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/159,709

(22) Filed: Oct. 14, 2018

(65) Prior Publication Data
US 2019/0051545 A1    Feb. 14, 2019

Related U.S. Application Data

(62) Division of application No. 15/009,833, filed on Jan. 29, 2016, now Pat. No. 10,103,042.

(51) Int. Cl.
| | | |
|---|---|---|
| *B05C 13/00* | (2006.01) | |
| *H01L 21/67* | (2006.01) | |
| *C23C 18/16* | (2006.01) | |
| *B05C 11/06* | (2006.01) | |
| *H01L 21/673* | (2006.01) | |

(52) U.S. Cl.
CPC ........ *H01L 21/67196* (2013.01); *B05C 11/06* (2013.01); *C23C 18/1691* (2013.01); *H01L 21/67109* (2013.01); *H01L 21/67201* (2013.01); *H01L 21/67303* (2013.01)

(58) Field of Classification Search
USPC ........ 118/58, 69, 62, 66, 500; 165/100, 101, 165/103
See application file for complete search history.

(56) References Cited

U.S. PATENT DOCUMENTS

| | | | | |
|---|---|---|---|---|
| 5,407,350 A | * | 4/1995 | Iwabuchi | C23C 16/54 432/11 |
| 2008/0045030 A1 | * | 2/2008 | Tahara | H01L 21/02063 438/715 |
| 2011/0311339 A1 | * | 12/2011 | Yasui | H01J 37/32743 414/217 |

* cited by examiner

*Primary Examiner* — Yewebdar T Tadesse
(74) *Attorney, Agent, or Firm* — JCIPRNET (57) ABSTRACT

A semiconductor processing station including a central transfer chamber, a load lock chamber disposed adjacent to the central transfer chamber, and a cooling stage disposed adjacent to the load lock chamber and the central transfer chamber is provided. The load lock chamber is adapted to contain a wafer carrier including a plurality of wafers. The central transfer chamber communicates between the cooling stage and the load lock chamber to transfer a wafer of the plurality of wafers between the cooling stage and the load lock chamber.

7 Claims, 6 Drawing Sheets

SEMICONDUCTOR PROCESSING STATION

CROSS-REFERENCE TO RELATED APPLICATION

This application is a divisional application of U.S. application Ser. No. 15/009,833, filed on Jan. 29, 2016. The entirety of the above-mentioned patent application is hereby incorporated by reference herein and made a part of this specification.

BACKGROUND

During semiconductor processes, wafers are treated or processed as desired by a user. In some processes, the wafers will have undesirably rough surfaces that include hillocks. The presence of hillocks is a defect in the wafers that may cause a metal to metal shorting phenomenon. Thus, the wafers may be annealed in order to enlarge the metal grain size in the wafers and avoid a hillock phenomenon. However, the anneal process towards the wafers does not always perform fast or efficiently enough and the hillock phenomenon may still be significant. It is important for the annealing process of the wafers to be fast and efficient in order to reduce the hillock phenomenon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
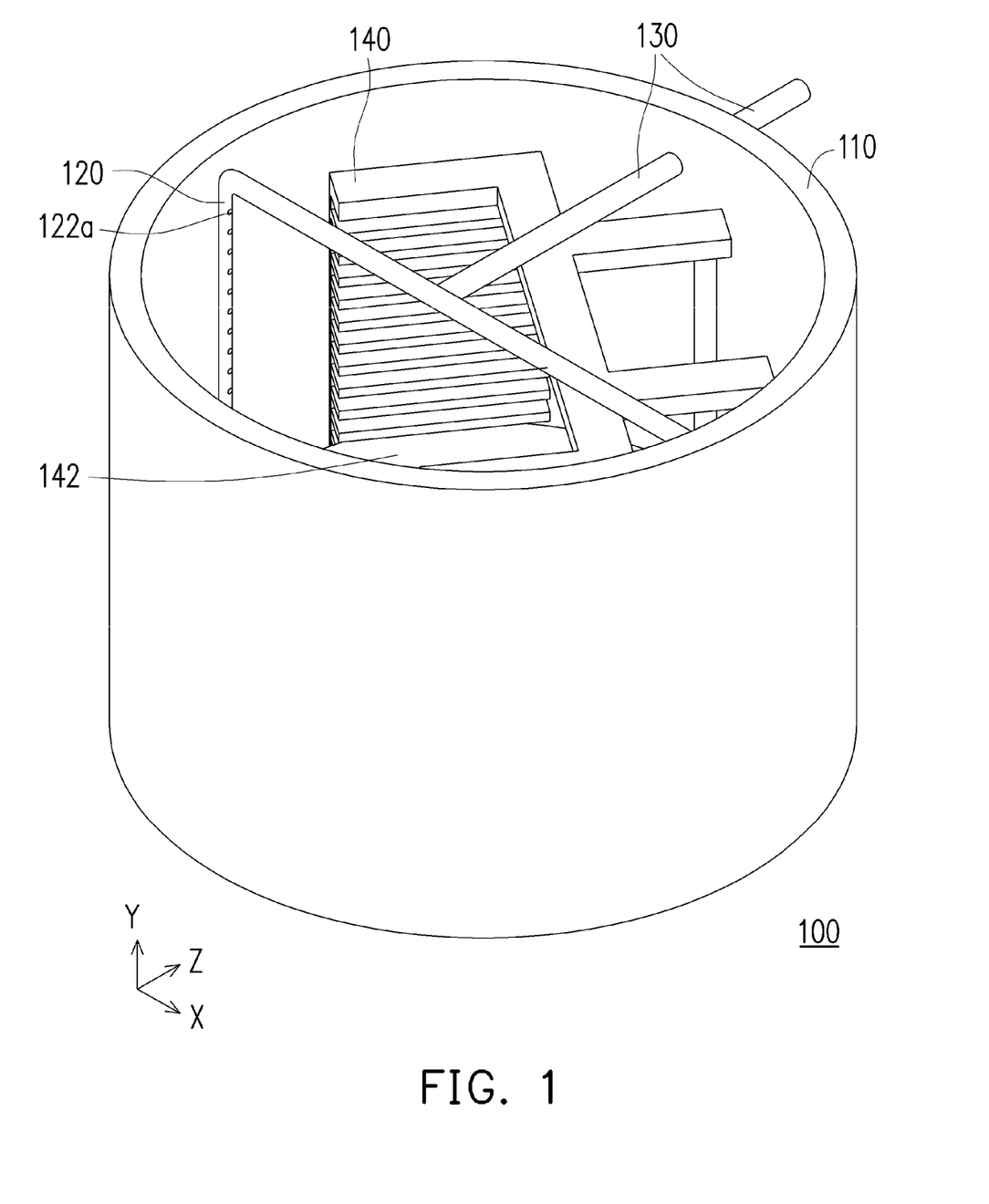
FIG. 1 is a schematic view of a chamber according to some embodiments of the disclosure.
Figure 2:
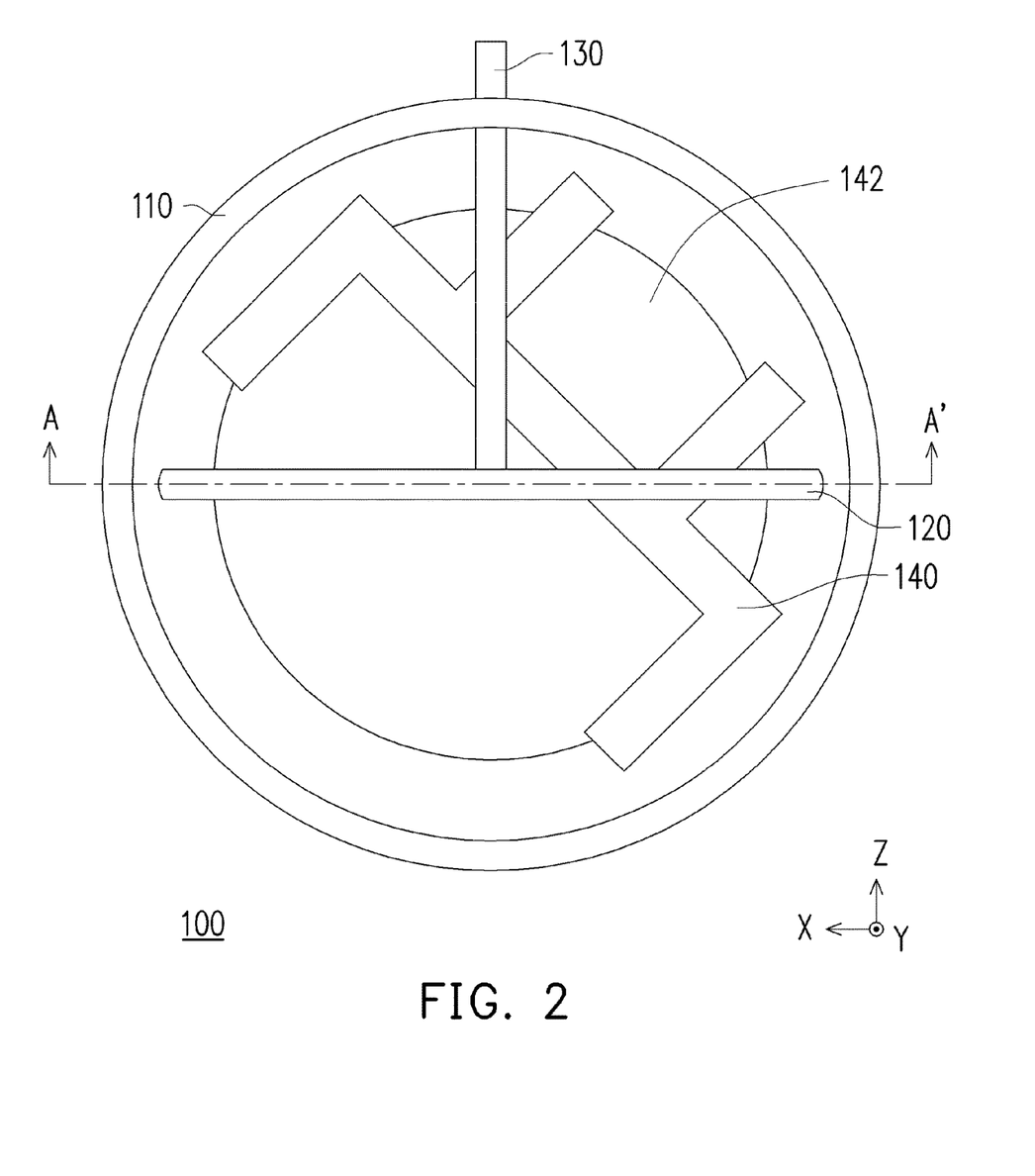
FIG. 2 is a schematic top view of the chamber of FIG. 1.
Figure 3:
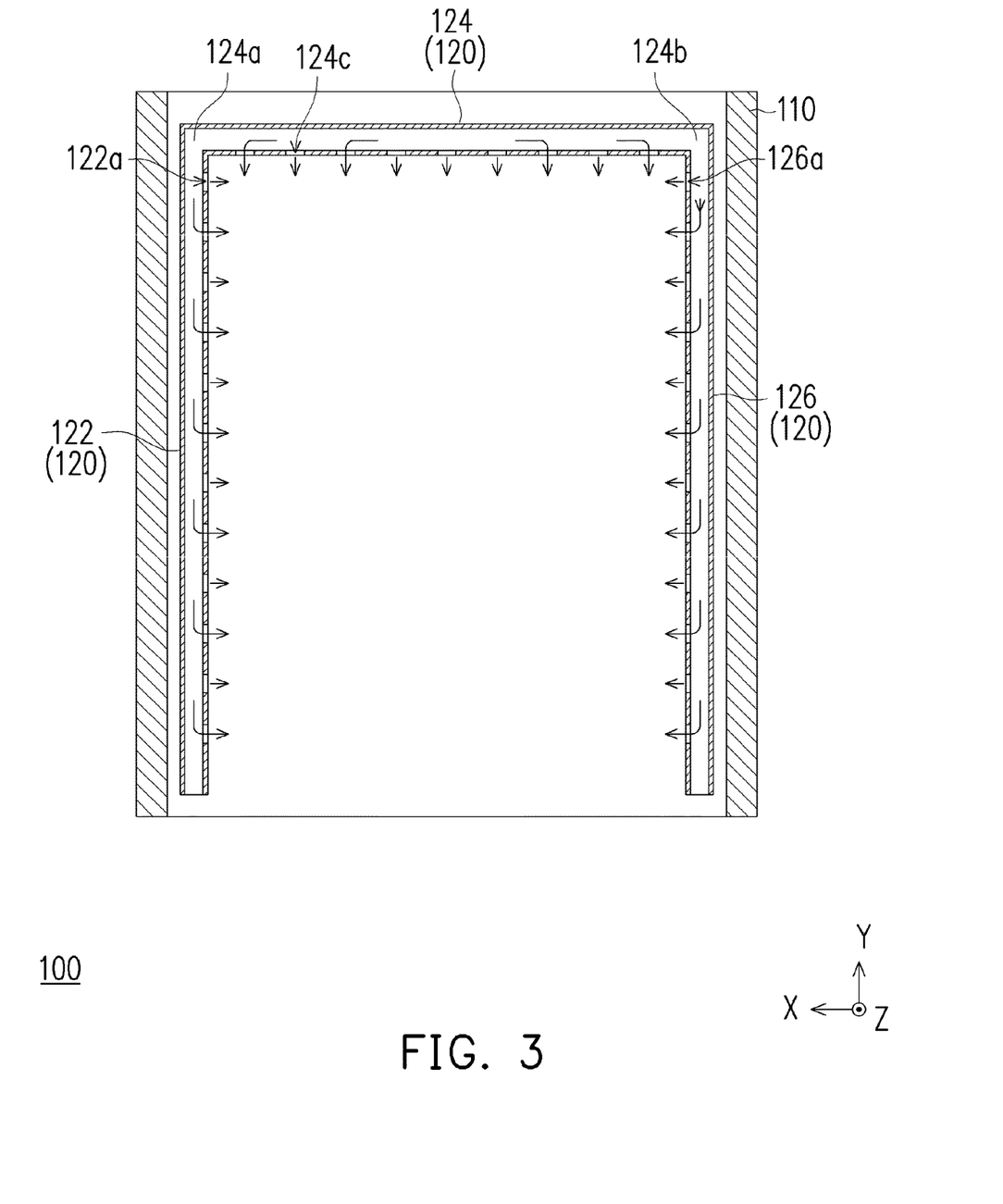
FIG. 3 is a cross-sectional view of the chamber of FIG. 2 taken along line A-A'.

FIG. 1 is a schematic view of a chamber according to some embodiments of the disclosure. FIG. 2 is a schematic top view of the chamber of FIG. 1. FIG. 3 is a cross-sectional view of the chamber of FIG. 2 taken along line A-A'. Referring to FIG. 1 to FIG. 3, a chamber 100 includes a sidewall 110, a cooling pipe 120, and an external pipe 130. The cooling pipe 120 is disposed in the chamber 100, and includes a first segment 122 extending along the sidewall 110 in a height direction of the chamber 100. In some embodiments, as seen in FIG. 1 to FIG. 3, the height direction of the chamber 100 is the Y direction. However, the disclosure is not limited thereto. The height direction of the chamber 100 is direction in which the height of the chamber 100 is measured. The Y direction being the height direction of the chamber 100 is merely exemplary and only used to better describe the exemplary embodiment. The first segment 122 includes a plurality of purge nozzles 122a. The chamber 100 further includes the external pipe 130, extending from outside the chamber 100 to inside the chamber 100.

In some embodiments, as seen in FIG. 1 to FIG. 3, the cooling pipe 120 further includes a second segment 124 having a first end 124a and a second end 124b. The second segment 124 extends along a width direction of the chamber 100. The width direction, is for example, the X direction, but is merely exemplary and only used to better describe the exemplary embodiment. The first segment 122 of the cooling pipe 120 is disposed below the second segment 124 of the cooling pipe 120 and connected to the first end 124a of the second segment 124. The external pipe 130 is connected to the second segment 124 between the first end 124a and the second end 124b, so as to provide a fluid to flow through the first segment 122 and the second segment 124 of the cooling pipe 120. That is to say, the external pipe 130 with a portion outside the chamber 100 may be connected to the fluid source so as to provide the fluid to inside the chamber 100 and to the cooling pipe 120. In some embodiments, the fluid provided to the cooling pipe 120 is a cooling gas. The cooling gas may be any gas suitable to cool the chamber 100. However, the disclosure is not limited thereto. In some embodiments, the fluid may also be a cooling liquid, and may be any liquid suitable to cool the chamber 100.

In some embodiments, as seen in FIG. 3, the cooling pipe 120 further includes a third segment 126 disposed below the second segment 124. The third segment 126 is connected to the second end 124b of the second segment 124. The third segment 126 extends along the sidewall in the height direction of the chamber 100 similar to the first segment 122 and includes a plurality of purge nozzles 126a. As seen in FIG. 3 of the embodiment, the first segment 122 and the third segment 126 of the cooling pipe 120 are disposed adjacent to different sides of the chamber 100. In particular, the first segment 122 and the third segment 126 of the cooling pipe 120 are disposed adjacent to opposite sides of the chamber 100. However, the disclosure is not limited thereto. The first segment 122 and the third segment 126 do not have to be on opposite sides of the chamber 100, but may be on different sides of the chamber 100 and still connected with the second segment 124 of the cooling pipe 120. If the first segment 122 and the third segment 126 are not on opposite sides of the chamber 100, the second segment 124 may not be straight, but may be bent according to the location of the first segment 122 and the third segment 126.

In some embodiments, the chamber 100 is adapted to contain a wafer carrier 140. The wafer carrier 140 carries a plurality of wafers 142, and the wafers 142 are adapted to be cooled in the chamber 100. In FIG. 1 and FIG. 2, only one wafer 142 is shown so as to better depict all elements of the chamber 100. In FIG. 3, the wafer carrier 140 is not shown in order to better illustrate the cooling pipe 120 and the chamber 100. In some embodiments, multiple wafers 142 may be disposed in the wafer carrier 140. That is to say, the fluid flowing through the cooling pipe is adapted to cool the wafers 142 when the wafer carrier 140 is in the chamber 100. In some embodiments, the purge nozzles 122a of the first segment 122 of the cooling pipe 120 and the purge nozzles 126a of the third segment of the cooling pipe 120 face inwards and away from the sidewall 110 so that the fluid provided by the external pipe 130 to the cooling pipe 120 outputs from the purge nozzles 122a of the first segment 122 of the cooling pipe 120 and the purge nozzles 126a of the third segment of the cooling pipe 120. Since the purge nozzles 122a and the purge nozzles 126a face inwards and away from the sidewall 110, the fluid is able to easily reach the wafers 142 of the wafer carrier 140 and cool the wafers 142. That is to say, the purge nozzles 122a and the purge nozzles 126a face away from the sidewall 110 and face towards the wafers 142 of the wafer carrier 140. However, the disclosure is not limited thereto. The purge nozzles 122a and the purge nozzles 126a may face in any direction within the chamber 100 as desired by the user. In some embodiments, the user may not want the fluid to directly output towards the wafers 142, and so the purge nozzles 122a and the purge nozzles 126a may face in different directions not towards the wafers 142. One of ordinary skill in the art may adjust the direction that the purge nozzles 122a and the purge nozzles 126a face according to design requirements.

In some embodiments, the second segment 124 of the cooling pipe 120 includes a plurality of purge nozzles 124c. The purge nozzles 124c face inwards towards the wafers 142 of the wafer carrier 140 so that the fluid provided by the external pipe 130 to the second segment 124 of the cooling pipe outputs toward the inside of the chamber 100 and towards the wafers 142 of the wafer carrier 140. However, the disclosure is not limited thereto. The purge nozzles 124c may face in any direction within the chamber 100 as desired by the user. In some embodiments, the user may not want the fluid to directly output towards the wafers 142, and so the purge nozzles 124c may face in different directions not towards the wafers 142. One of ordinary skill in the art may adjust the direction that the purge nozzles 124c face according to design requirements. In addition, the fluid provided from the external pipe 130 flows into the second segment 124 and then into the first segment 122 and the third segment 126. It can be seen from the arrows of FIG. 3 the direction that the fluid flows within the cooling pipe 120 and out of the purge nozzles 122a, 124c, 126a. The arrows of the fluid shown in FIG. 3 are merely exemplary, and used to better describe an exemplary embodiment of the fluid in the cooling pipe 120. The directions of the arrows of the fluid shown in FIG. 3 are not meant to limit the disclosure.

In some embodiments, the purge nozzles 122a, 124c, 126a are evenly distributed entirely across the corresponding first segment 122, second segment 124, and third segment 126 so as to output the fluid to different parts of the wafer carrier 140. That is to say, the top portion, middle portion, and bottom portion of the wafer carrier 140 carrying wafers 142 in different portions are able to be cooled by the fluid outputted from the purge nozzles 122a, 124c, 126a. However, the disclosure is not limited thereto. The distribution of the purge nozzles 122a, 124c, 126a may be adjusted according to design requirements. For example, if the user desires a specific portion of the wafer carrier 140 to be cooled faster, such as the middle portion, then the purge nozzles 122a and 126a may be denser in the middle of the corresponding first segment 122 and third segment 126. The distribution of the purge nozzles 122a, 124c, 126a do not have to be evenly distributed entirely across the corresponding first segment 122, second segment 124, and third segment 126. Rather, one of ordinary skill in the art may adjust the distribution of the purge nozzles 122a, 124c, 126a according to design requirements.

In some embodiments, by including the cooling pipe 120 within the chamber 100, the wafers 142 in the chamber 100 can be cooled faster. Thus, when the wafers 142 are annealed and the placed in the chamber 100 to cool to reduce the hillock phenomenon, the faster cooling with the cooling pipe 120 can provide a faster and more efficient annealing process. The faster annealing process may improve the efficiency of enlarging the metal grain sizes (for example copper grain sizes) of the wafers 142. Thus, the cooling effect provided by the cooling pipe 120 improves the efficiency and speed of the annealing process, and thus the hillock phenomenon in the wafers 142 can also be greatly reduced.

Figure 4:
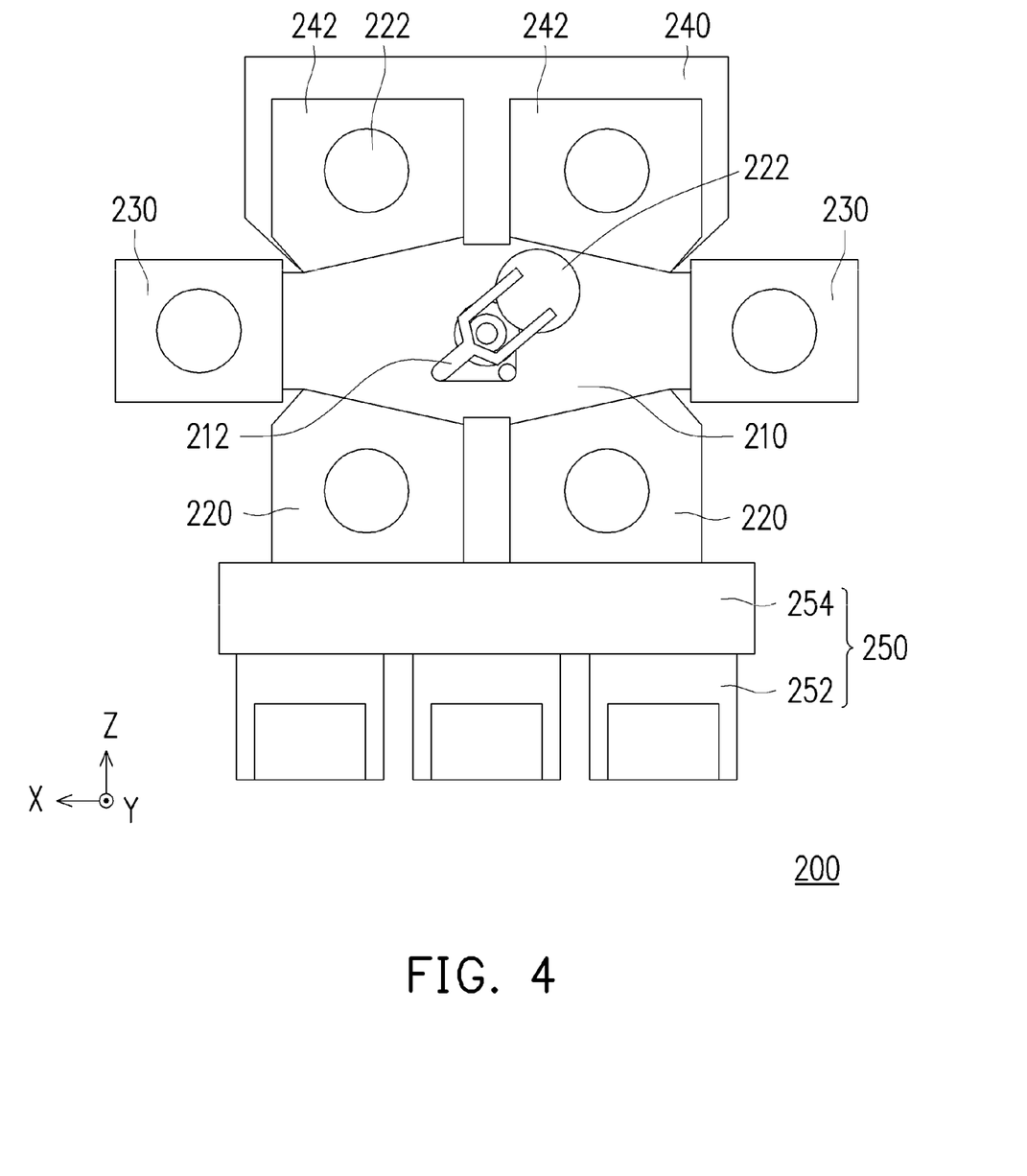
FIG. 4 is a schematic top view of a semiconductor processing station according to some embodiments of the disclosure.

FIG. 4 is a schematic top view of a semiconductor processing station according to some embodiments of the disclosure. Referring to FIG. 4, a semiconductor processing station 200 includes a central transfer chamber 210, a load lock chamber 220, and a cooling stage 230. The load lock chamber 220 is disposed adjacent to the central transfer chamber 210. The load lock chamber 220 is adapted to contain a wafer carrier (not shown) containing a plurality of wafers 222. The cooling stage 230 is disposed adjacent to the load lock chamber 220 and the central transfer chamber 210. The central transfer chamber 210 communicates between the cooling stage 230 and the load lock chamber 220 to transfer a wafer 222 of the plurality of wafers 222 between the cooling stage 230 and the load lock chamber 220.

In some embodiments, the semiconductor processing station further includes a platform 240 disposed adjacent to the central transfer chamber 210. The platform 240 includes a plurality of processing modules 242. The central transfer chamber 210 communicates between the platform 240 and the load lock chamber 220 to transfer a wafer 222 between the platform 240 and the load lock chamber 220. Specifically, the central transfer chamber 210 is disposed in the middle surrounded by the load lock chambers 220 (two are shown), the cooling stages 230 (two are shown), and the platform 240 having the processing modules 242 (two are shown). The number of load lock chambers 220, the cooling stages 230, and the processing modules 242 are merely exemplary, and may be adjusted according to user requirements.

In some embodiments, the central transfer chamber 210 communicates between the processing modules 242, the load lock chambers 220, and the cooling stages 230 through an interface robot 212 that moves around in the central transfer chamber 210. The interface robot 212 may carry the wafer 222 to place the wafer 222 in one of the processing modules 242, the load lock chambers 220, and the cooling stages 230. In FIG. 4, each of the processing modules 242, the load lock chambers 220, and the cooling stages 230 are shown carrying a wafer 222 for descriptive purposes only, and are merely exemplary. While the semiconductor processing station 200 is running, sometimes each of the processing modules 242, the load lock chambers 220, and the cooling stages 230 are not carrying a wafer 222.

In some embodiments, the semiconductor processing station 200 includes an equipment front end module (EFEM) 250. The EFEM 250 includes an interface module 254 and a plurality of load ports 252 (three are shown as an example). The load ports 252 are adapted to receive and carry a plurality of wafers 222. The interface module 254 of the EFEM 250 communicates between the load ports 252 and the load lock chambers 220 so as to transfer the wafers 222 between the load ports 252 and the load lock chambers 220. The shapes of the elements of the semiconductor processing station 200 shown in FIG. 4 are merely exemplary, and are only drawn to as an example for description purposes only. The shapes shown in FIG. 4 are not meant to limit the disclosure.

In some embodiments, the interface module 254 transfers the wafers 222 from the load ports 252 to the corresponding load lock chambers 220. The wafers 222 are to be processed in the processing modules 242. Thus, the central transfer chamber 210 with the interface robot 212 may carry a wafer 222 to be processed from the load lock chamber 220 to the processing module 242. While, the wafer 222 is being processed, the interface robot 212 may carry another wafer 222 to be processed from the load lock chamber 220 to another processing module 242. After the wafer 222 is processed in the interface robot 212, the interface robot 212 may retrieve the processed wafer 222 and carry the processed wafer 222 to the cooling stage 230 for the processed wafer 222 to be cooled. After the processed wafer 222 is cooled to a certain point, the interface robot 212 may move the processed wafer 222 from the cooling stage 230 to the load lock chamber 220. The user may determine the point at which the processed wafer 222 is cooled enough to be moved to the load lock chamber 220. This process may be continued to as the interface robot 212 moves wafers 222 from the load lock chamber 220 to the processing modules 242 to be processed, and moves the processed wafers from the processing modules 242 to the cooling stage 230. Then, once the wafers 222 on the cooling stage 230 are cooled, the interface robot 212 may move the wafer 222 from the cooling stage 230 to the load lock chamber 220. When the load lock chamber 220 is full of processed wafers 222, the interface module 254 may transfer the processed wafers 222 to the load port 252 to exit the semiconductor processing station 200.

In some embodiments, the cooling stage 230 is cooled prior to placing a processed wafer 222 onto the cooling stage 230. The cooling stage 230 is cooled by providing a fluid to flow around the cooling stage 230. More specifically, the cooling stage 230 may have cooling liquid flow below the cooling stage 230 so as to reduce the temperature of the cooling stage 230. Then, by placing the processed wafer 222 onto the cooling stage 230, the processed wafer 222 may also be cooled. The cooling liquid may continually flow below the cooling stage 230. One of ordinary skill in the art may control the frequency and amount of cooling liquid flowing around or below the cooling stage 230.

In some embodiments, since the semiconductor processing station 200 includes the cooling stage 230, when the wafers 222 are processed (for example annealed) to reduce the hillock phenomenon, the faster cooling with the cooling stage 230 can provide a faster annealing process. The faster annealing process may improve the efficiency of enlarging the metal grain sizes (for example copper grain sizes) of the wafers 222. The cooling effect provided by the cooling stage 230 improves the efficiency and speed of the annealing process, and thus the hillock phenomenon in the wafers 222 can also be greatly reduced.

In some embodiments, the load lock chamber 220 may be the chamber 100 shown in FIG. 1 to FIG. 3. That is, the load lock chamber 220 may also be the chamber 100 including the cooling pipe 120 so as to further cool the processed wafers 222 in addition to the cooling from the cooling stage 230. However, the disclosure is not limited thereto, and the load lock chamber 220 may be a chamber without the cooling pipe 120.

Figure 5:
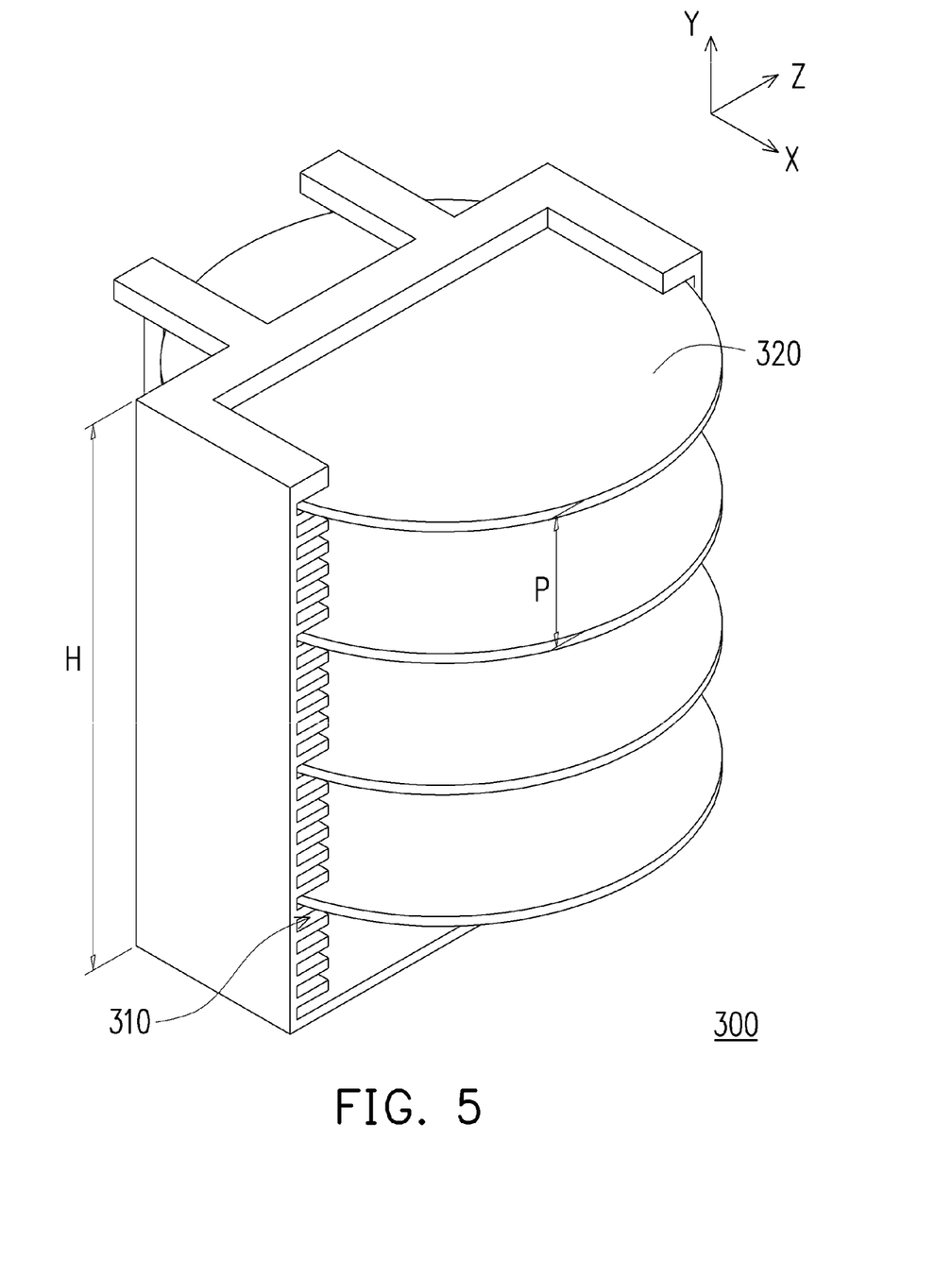
FIG. 5 is a schematic front view of a wafer carrier according to some embodiments of the disclosure.

FIG. 5 is a schematic front view of a wafer carrier according to some embodiments of the disclosure. Referring to FIG. 5, the wafer carrier 300 includes a plurality of slots 310 and a plurality of wafers 320. The wafer carrier 300 includes a height H, and there is a pitch P between each of the wafers 320. The pitch P may be, for example, measured from a top surface of the wafer 320 to the top surface of the next wafer 320. The pitch P between each of the wafers 320 is the height H of the wafer carrier 300 divided by x. That is to say, in some embodiments the number of slots 310 is greater than the number of wafers 320. For example, as seen in FIG. 5, the number of wafers 320 is four, and the number of slots 310 is 24. Thus, the value of x is, for example, four or may be less than four in some embodiments depending on the number of wafers 320. In some embodiments, the number of slots 310 may be 24, and the number of wafers 320 is nine. Thus, the value of x is, for example, nine or less than nine in some embodiments depending on the number of wafers 320. However, the disclosure is not limited thereto, and the number of slots 310 may also be the same as the number of wafers 320, or the number of wafers 320 may be adjusted to achieve the desired pitch P. In addition, the number of slots 310 may also be adjusted. In some embodiments, at least one wafer 320 is placed in the wafer carrier 300, and the value of x which determines the pitch P may be adjusted according to the number of wafers 320 in the wafer carrier 300. As the value of x is lower, the value of the pitch P is greater. The wafer carrier 300 may be the wafer carrier contained in the chamber 100 of FIG. 1 to FIG. 3. Furthermore, the wafer carrier 300 may be the wafer carrier contained in the load lock chamber 220 of FIG. 4. By having the pitch P between the wafers 320 be the height H of the wafer carrier 300 divided by x, then the wafers 320 can be cooled faster and more efficiently in the chamber 100 or the load lock chamber 220. Therefore, when the wafer carrier 300 is contained in the chamber 100 of FIG. 1 to FIG. 3, the wafer carrier 300 may be cooled even faster because of the cooling pipe 120. In addition, when the wafer carrier 300 is contained in the load lock chamber 220, the wafers 320 may also be cooled by the cooling station 230 and then moved into the wafer carrier 300. In some embodiments, the wafer carrier 300 is contained in the chamber 100, and the chamber 100 is the load lock chamber 220. That is to say, the wafers 320 in the wafer carrier 300 may be cooled faster because of the pitch P between the wafers 320, the cooling pipe 120, and the cooling stage 230 of the semiconductor processing station 200. The faster cooling improves the efficiency and speed of the annealing process towards the wafer, and thus the hillock phenomenon in the wafers can also be greatly reduced.

Figure 6:
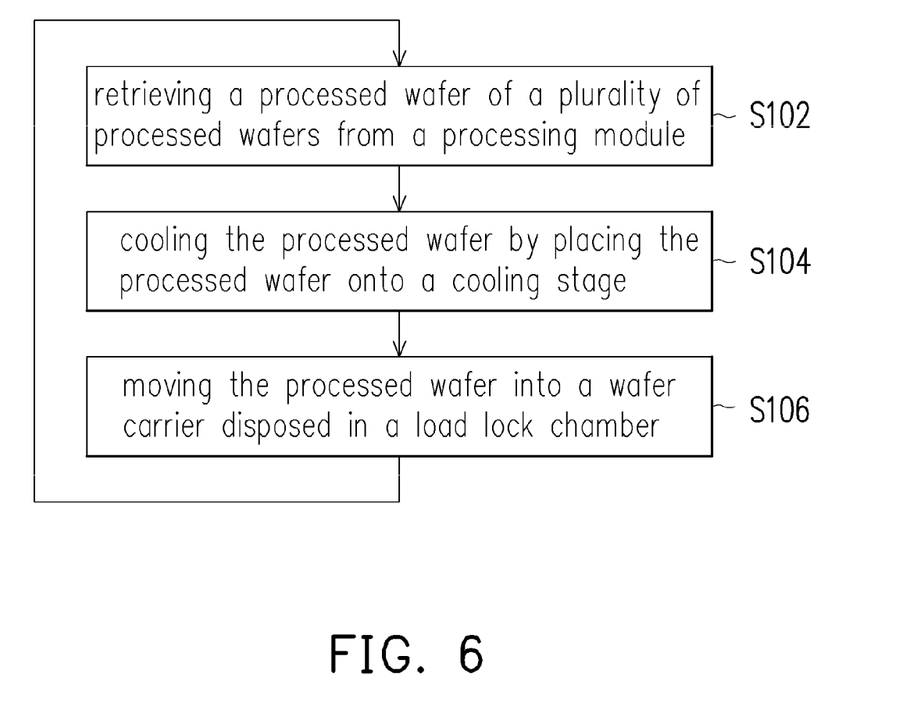
FIG. 6 is a flow chart of a semiconductor process according to some embodiments of the disclosure.

FIG. 6 is a flow chart of a semiconductor process according to some embodiments of the disclosure. The semiconductor process is performed by the semiconductor processing station 200, and the following steps are performed. In step S102, a processed wafer 222 from the processing module 242 is retrieved. Next, in step S104, the processed wafer 222 is cooled by placing the processed wafer 222 onto the cooling stage 230. Prior to step S104, the cooling stage 230 may be cooled by providing a fluid to flow around the cooling stage 230. The cooling process of the cooling stage 230 may be referred to in the above description, and will not be repeated herein. Next, in step S106, the processed wafer 222 from the cooling stage 230 is moved into a wafer carrier disposed in the load lock chamber 220. Next, step S102 to step S106 are repeated to retrieve and cool another processed wafer 222.

After step S106, when the processed wafers 222 are moved from the cooling stage 230 to the wafer carrier in the load lock chamber 220, the processed wafers 222 are cooled in the load lock chamber 220. Specifically, the load lock chamber 220 may be the chamber 100 of FIG. 1 to FIG. 3, and include the cooling pipe 120 to further cool the processed wafers. However, the load lock chamber 220 may also be a different chamber than the chamber 100 of FIG. 1 to FIG. 3, and also cool the processed wafers 222 through heat dissipation or a different cooling pipe.

In some embodiments, in step S102, the processed wafer 222 is retrieved by the interface robot 212 of the central transfer chamber 210 from the processing module 242. In step S104, the interface robot 212 of the central transfer chamber 210 places the processed wafer 222 onto the cooling stage 230. In step S106, the interface robot 212 of the central transfer chamber 210 moves the processed wafer 222 from the cooling stage 230 into the wafer carrier disposed in the load lock chamber 220. However, processed wafer 222 may be moved through any suitable method by the user in steps S102 to S106. The disclosure is not limited thereto.

According to some embodiments, a chamber is adapted to contain a wafer carrier. The chamber includes a sidewall, a cooling pipe, and an external pipe. The cooling pipe is disposed in the chamber and includes a first segment extending along the sidewall in a height direction of the chamber. The first segment includes a plurality of purge nozzles. The external pipe extends from outside the chamber to inside the chamber and is connected to the first segment of the cooling pipe so as to provide a fluid to the cooling pipe.

According to some embodiments, a semiconductor processing station includes a central transfer chamber, a load lock chamber, and a cooling stage. The load lock chamber is disposed adjacent to the central transfer chamber and is adapted to contain a wafer carrier having a plurality of wafers. The cooling stage is disposed adjacent to the load lock chamber and the central transfer chamber. The central transfer chamber communicates between the cooling stage and the load lock chamber to transfer a wafer of the plurality of wafers between the cooling stage and the load lock chamber.

According to some embodiments, a semiconductor process using a semiconductor processing station includes the following steps. A processed wafer of a plurality of processed wafers is retrieved from a processing module. The processed wafer is cooled by placing the processed wafer onto a cooling stage. The processed wafer is moved from the cooling stage into a wafer carrier disposed in a load lock chamber. The steps are repeated to retrieve and cool another processed wafer of the processed wafers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor processing station comprising:
   a central transfer chamber;
   a load lock chamber disposed adjacent to the central transfer chamber, wherein the load lock chamber contains a wafer carrier comprising a plurality of wafers, and the load lock chamber comprises:
      a sidewall;
      a cooling pipe disposed inside the load lock chamber, and the cooling pipe comprising:
         a first segment extending along the sidewall in a height direction of the load lock chamber;
         a second segment having a first end and a second end, and the second segment extending along a width direction of the load lock chamber, wherein the first segment is disposed below the second segment and connected to the first end of the second segment; and
      an external pipe extending from outside the load lock chamber to inside the load lock chamber, wherein the external pipe is connected to the second segment between the first end and the second end so as to provide a fluid to flow through the first segment and the second segment of the cooling pipe; and
   a cooling stage disposed adjacent to the load lock chamber and the central transfer chamber, wherein the central transfer chamber communicates between the cooling stage and the load lock chamber to transfer a wafer of the plurality of wafers between the cooling stage and the load lock chamber.

2. The semiconductor processing station as claimed in claim 1, further comprising:
   a platform disposed adjacent to the central transfer chamber, and the platform comprising a plurality of processing modules, wherein the central transfer chamber communicates between the platform and the load lock chamber.

3. The semiconductor processing station as claimed in claim 1, further comprising:
   an equipment front end module comprising a load port and an interface module, wherein the interface module communicates between the load port and the load lock chamber.

4. The semiconductor processing station as claimed in claim 1, wherein the cooling stage is equipped with a cooling liquid flowing below the cooling stage.

5. The semiconductor processing station as claimed in claim 1, wherein the cooling pipe further comprises a third segment disposed below the second segment and connected to the second end of the second segment, wherein the third segment extends along the sidewall in the height direction of the load lock chamber, the first segment of the cooling pipe and the third segment of the cooling pipe are disposed adjacent to different sides of the load lock chamber.

6. The semiconductor processing station as claimed in claim 5, wherein the first segment of the cooling pipe and the third segment of the cooling pipe are disposed adjacent to opposite sides of the load lock chamber.

7. The semiconductor processing station as claimed in claim 6, wherein a plurality of purge nozzles of the second segment of the cooling pipe and a plurality of purge nozzles of the third segment of the cooling pipe face inwards and away from the sidewall so that the fluid provided by the external pipe outputs from the plurality of purge nozzles of the second segment and the plurality of purge nozzles of the third segment away from the sidewall.

* * * * *